(12) United States Patent
Choi et al.

(10) Patent No.: US 9,580,794 B2
(45) Date of Patent: Feb. 28, 2017

(54) PREPARING METHOD OF VERTICALLY GROWN NANOSTRUCTURES OF C60 AND CONJUGATED MOLECULE

(71) Applicant: POSTECH ACADEMY-INDUSTRY FOUNDATION, Pohang-si (KR)

(72) Inventors: Hee Cheul Choi, Pohang-si (KR); Jungah Kim, Seosan-si (KR)

(73) Assignee: POSTECH ACADEMY-INDUSTRY FOUNDATION, Pohangsi (KR)

(*) Notice: Subject to any disclaimer, the term of this patent is extended or adjusted under 35 U.S.C. 154(b) by 150 days.

(21) Appl. No.: 14/225,681

(22) Filed: Mar. 26, 2014

(65) Prior Publication Data

US 2015/0259781 A1    Sep. 17, 2015

(30) Foreign Application Priority Data

Mar. 12, 2014  (KR) .................. 10-2014-0029156

(51) Int. Cl.
*B05D 3/00* (2006.01)
*C23C 14/06* (2006.01)
*B05D 3/04* (2006.01)
*C01B 31/02* (2006.01)

(52) U.S. Cl.
CPC ........... *C23C 14/0605* (2013.01); *B05D 3/007* (2013.01); *B05D 3/0486* (2013.01); *C01B 31/0213* (2013.01); *C01B 31/0253* (2013.01)

(58) Field of Classification Search
CPC ................................. B05D 3/007; B05D 3/107
See application file for complete search history.

(56) References Cited

U.S. PATENT DOCUMENTS

| 7,829,143 B1* | 11/2010 | Bollman | B05D 3/0453 |
| | | | 427/248.1 |
| 2013/0210189 A1* | 8/2013 | Forrest | H01L 51/0028 |
| | | | 438/82 |

OTHER PUBLICATIONS

Kim et al. Vertical Crystallization of C60 nanowires by Solvent Vapor Annealing Process. ACNano, vol. 7, No. 10, 9122-9128. Published online Sep. 9, 2013.*
Mascero et al. Forming oriented organic crystals from amorphous thin films on patterned substrates via solvent-vapor annealing. Organic Electronics 6 (2005) 211-220.*
Jungah Kim et al., "Vertical Crystallization of C60 Nanowires by Solvent Vapor Annealing Process", ACS Nano, Sep. 2013, vol. 10, pp. 9122-9128.
Mingguang Yaoa et al., Synthesis and growth mechanism of differently shaped C60 nano/microcrystals produced by evaporation of various aromatic C60 solutions, Carbon, Jan. 2009, vol. 47, pp. 1181-1188.

(Continued)

*Primary Examiner* — David Turocy
(74) *Attorney, Agent, or Firm* — Lex IP Meister, PLLC (57) ABSTRACT

This disclosure relates to a method for preparing vertically grown nanostructures of $C_{60}$ and conjugated molecules, including: forming a $C_{60}$ film or a conjugated organic molecular film; and introducing the $C_{60}$ film or conjugated organic molecular film and a solvent into an airtight container, and then conducting solvent vapor annealing. According to the preparation method, $C_{60}$ molecules and conjugated molecules may be vertically grown under mild conditions by a simple process.

10 Claims, 7 Drawing Sheets

(56) References Cited

OTHER PUBLICATIONS

Jungah Kim, et al., "Vertical Self-assembled 1D C60 Nanowire and 2D C60 Nonodisk", 2013 MRS Spring Meeting & Exhibit, San Francisco, California, U.S.A., Apr. 1, 2013.

Jungah Kim, et al., "Vertical Self-Assembly of Fullerenes via Solvent Vapor Annealing Process", Abstract #1083, 223rd ECS Meeting, 2013 The Electrochemical Society, May 16, 2013.

Jungah Kim, et al., "Vertical self-Crystallization of Conjugated Molecules by Solvent Vapor Annealing Process", The 14th International Conference on the Formation of Semiconductor Interfaces (ICFSI), Hyundai Hotel, Gyeongju, Korea, Jun. 30, 2013.

Jungah Kim, et al., "Growth direction controlled crystallization of fullerene molecules", Inorganic Chemistry Symposium, The Korean Chemical Society (KCS), Haeundae Grand Hotel, Busan, S. Korea, Aug. 26, 2013.

Jungah Kim, et al., "Vertical Crystallization of Organic Molecules by Solvent Vapor Annealing", The Korean Chemical Society (KCS), Chemworld, vol. 53, No. 10, Oct. 2013.

* cited by examiner

PREPARING METHOD OF VERTICALLY GROWN NANOSTRUCTURES OF C60 AND CONJUGATED MOLECULE

TECHNICAL FIELD

The present invention relates to a method for preparing vertically grown nanostructures of $C_{60}$ and conjugated molecules, and more particularly to a method for preparing vertically grown nanostructures by vertical crystallization of $C_{60}$ molecules and conjugated organic molecules under mild conditions by a simpler process.

BACKGROUND OF ART

Since efficient growth methods for $C_{60}$ molecules, conjugated organic molecules, and the like provide opportunities to design new soft building blocks of which properties are largely different from those observed from powder or solution phase, studies thereon are continuously being progressed.

One approach is to utilize spontaneous precipitation in solution phase that involves self-crystallization of target molecules at liquid-liquid, liquid-air, or liquid-air-solid interfaces, and particularly, crystallization at the liquid-air-solid interface can be achieved by a simple process, called a drop-drying process.

Organic molecules such as $C_{60}$ molecules, conjugated organic molecules, and the like are readily crystallized by the drop-drying process into 0D, 1D, and 2D nano- to micro-structures at room temperature by simply dissolving them in a solvent and then drop-drying. The drop-drying process has recently attracted much attention due to its simplicity as well as high efficiency in terms of yield and reaction time. However, one important drawback that has not yet been resolved is the controllability of growth direction.

Further, the vertical crystallization of conjugated molecules has been reported only for limited examples (peptides, 1,5-diaminoanthraquinone, copper phthalocyanine). Except for aromatic dipeptide nanotubes that have been vertically grown by the action of a fast evaporating solvent, all other examples require a high temperature, template, or physical vapor transport environment, and thus are not economically efficient and have limited industrial applications.

Accordingly, there is a demand for the development of a method for preparing vertically grown nanostructures of $C_{60}$ molecules, conjugated molecules, and the like, under mild conditions by a simpler process.

DETAILED DESCRIPTION OF THE INVENTION

Technical Problem

It is an object of the present invention to provide a method for preparing vertically grown nanostructures by vertical crystallization of $C_{60}$ molecules and conjugated organic molecules under mild conditions by a simpler process.

Technical Solution

The present invention provides a method for preparing vertically grown nanostructures of $C_{60}$ and conjugated molecules including forming a $C_{60}$ film or a conjugated organic molecular film, and introducing the $C_{60}$ film or conjugated organic molecular film and a solvent into a airtight container, and then conducting solvent vapor annealing.

Hereinafter, a method for preparing vertically grown nanostructures of $C_{60}$ and conjugated molecules according to specific embodiments of the invention will be explained in detail.

According to one embodiment, a method for preparing vertically grown nanostructures of $C_{60}$ and conjugated molecules including forming a $C_{60}$ film or a conjugated organic molecular film, introducing the $C_{60}$ film or conjugated organic molecular film and a solvent into an airtight container, and then conducting solvent vapor annealing is provided.

The inventors recognized that the existing drop-drying method for preparing organic molecules into 0D, 1D, and 2D nano- to micro-structures has a limitation in terms of the controllability of growth direction, and that although the vertical crystallization of conjugated molecules has been reported for limited organic molecules, the industrial application is not easy due to the process conditions and methods, and progressed studies on a method for controlling growth direction of nanostructures of $C_{60}$ molecules, conjugated molecules, and the like under mild conditions by a simpler process.

As a result, it was confirmed through experiments that vertically grown nanostructures can be prepared by vertical growth of $C_{60}$ and conjugated molecules, by a simple process of forming a $C_{60}$ film or a conjugated organic molecular film using $C_{60}$ molecules or conjugated organic molecules, introducing the film and a solvent into an airtight container, and then conducting solvent vapor annealing, and the present invention was completed.

In the method for preparing vertically grown nanostructures of $C_{60}$ and conjugated molecules according to one embodiment, the step of forming a $C_{60}$ film or a conjugated organic molecular film may include thermally evaporating $C_{60}$ molecules or conjugated organic molecules on a substrate.

Particularly, according to the method for preparing vertically grown nanostructures of $C_{60}$ and conjugated molecules, a $C_{60}$ film or a conjugated organic molecular film is formed using $C_{60}$ molecules or conjugated organic molecules, and solvent vapor annealing is conducted. In the case when $C_{60}$ molecules or conjugated organic molecules are prepared into a film and solvent vapor annealing is conducted, the molecules have a tendency to grow in the direction vertical to a substrate by the action of solvent molecules evaporating along the direction, and thus nanostructures of a thick and uniform shape may be obtained compared to the case wherein the $C_{60}$ molecules or conjugated organic molecules are not thermally evaporated.

The $C_{60}$ molecules generally refer to soccer ball-shaped connected molecules consisting of pentagons and hexagons, and it is one kind of fullerene.

Further, the conjugated organic molecules generally refer to organic molecules wherein at least two multiple bonds are connected each other by a single bond, and specific examples thereof may include 6,13-bis(triisopropylsilylethynyl)pentacene, rubrene, squaraine, 5,7,12,14-pentacenetetrone, and the like.

In addition, the substrate corresponds to a base for evaporation of the $C_{60}$ molecules or conjugated organic molecules, and substrates known to be used in the preparation of a film may be used without specific limitations. Particularly, a quartz, silicon oxide, or silicon substrate is preferably used because it may grow evaporated materials in the vertical direction without specific interactions with the materials.

The thermal evaporation means that $C_{60}$ molecules or conjugated organic molecules are heated to vaporize them, and are evaporated on the substrate in the form of a film (thin film), and the temperature, pressure, and time may be appropriately controlled according to the kind of evaporation materials.

More specifically, the thermal evaporation of $C_{60}$ molecules or conjugated organic molecules on a substrate may be conducted at a temperature of greater than or equal to 200° C., and preferably 250 to 1000° C. If the temperature is too low, the organic molecules fail to be completely vaporized and the thickness of the $C_{60}$ film or the conjugated organic molecular film may not be uniform, and if the temperature is too high, the organic molecules, the substrate, or the like may cause side reactions.

Further, the thermal evaporation may be conducted under a pressure of equal to or less than $10^{-5}$ Torr. If the pressure is too high, the mean free path of evaporation materials may become short and the thickness of the evaporated film may not be uniform, and thus a structure of uniform length may not be obtained.

In addition, the thermal evaporation may be conducted for 10 minutes to 24 hours.

The $C_{60}$ film or organic molecular film prepared by the above method may have a thickness of 10 to 100 nm. The thickness may be related to the length and the thickness of the prepared structure. If the film is too thin, it may be difficult to grow into a specific structure due to the small amount of $C_{60}$ molecules or conjugated organic molecules, and if the film is too thick, the interactions between the materials constituting the lower film may predominate over the interactions between the solvent and the film in the uppermost film that is influenced by solvent evaporation, and thus uniformly vertically grown nanostructures may not be prepared.

After the step of forming the $C_{60}$ film or organic molecular film including thermal evaporation of the $C_{60}$ molecules or conjugated organic molecules onto a substrate, the $C_{60}$ film or organic molecular film and a solvent may be introduced into a airtight container, and then solvent vapor annealing may be conducted.

For the preparation of vertically grown nanostructures of $C_{60}$ and conjugated molecules, it is preferable to control the main direction of solvent movement in the vertical direction. The solvent vapor annealing allows vaporization of the solvent and coverage of the $C_{60}$ film or conjugated organic molecular film with sufficient solvent vapor to wet $C_{60}$ molecules or conjugated molecules and to evaporate the solvent under a dynamic equilibrium. Since the solvent moves from the film in the vertical direction under the dynamic equilibrium, the $C_{60}$ molecules or conjugated molecules of the $C_{60}$ film or conjugated molecular film may be crystallized in the vertical direction by the action of the solvent moving in the vertical direction.

Figure 1:
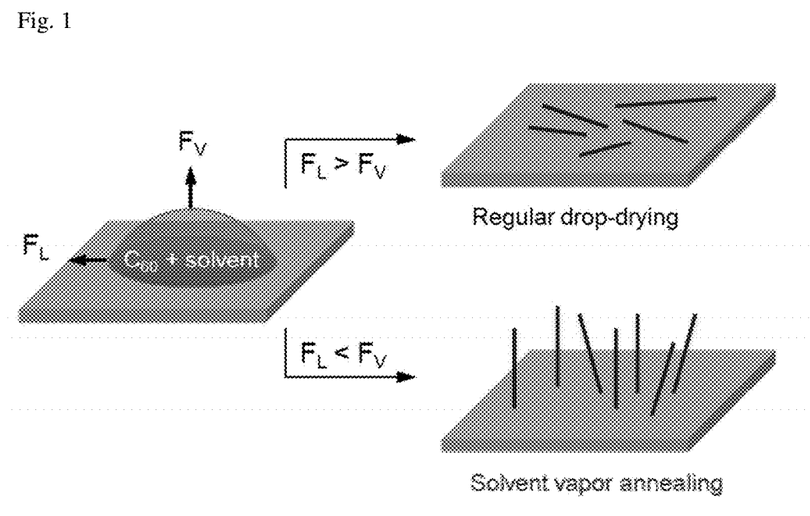
FIG. 1 shows a schematic representation of forces applied to micro-sized droplets.

More specifically, with reference to FIG. 1 that is a schematic representation of the force applied to micro-sized droplets, in the regular drop-drying process of a solution of $C_{60}$ molecules in a solvent, large droplets are formed, and the lateral force of the solvent ($F_L$) is dominant resulting in laterally crystallization of $C_{60}$ nanowires on a substrate.

To the contrary, in order for vertical crystallization to occur, $F_L$ should be minimized while maximizing vertical drying force of the solvent ($F_v$). If solvent vapor annealing of the $C_{60}$ film or conjugated organic molecular film is conducted using a solvent with a high vapor pressure as explained above, nanostructures may be vertically crystallized.

Thus, it is preferable to use compounds with high vapor pressure as the solvent, and for example, m-xylene, $CCl_4$, mesitylene, toluene, $CH_2Cl_2$, or a mixture thereof may be used.

The solvent vapor annealing of the $C_{60}$ film or conjugated organic molecular film may be conducted at 20 to 50° C., and preferably 20 to 30° C. If the temperature is too low, the solvent may not be vaporized, and sufficient active dynamic equilibrium for the above-explained vertical growth may not be achieved, such that uniformly vertically grown nanostructures may not be prepared. Further, if the temperature is too high, unnecessary solvents may dissolve the $C_{60}$ film or conjugated organic molecular film and exist around it, which is similar to drop-drying, and thus the molecules may be predominantly influenced by lateral movement over vertical evaporation, or unintended side reactions such as the reaction of the $C_{60}$ film or conjugated organic molecular film and the solvent may progress.

Particularly, the temperature of the solvent vapor annealing is just in the room temperature range, which is remarkably lower compared to that of a previously reported method of preparing vertically grown nanostructures, and thus reactions may be progressed under milder conditions. The temperature may be controlled with commonly used heaters such as ovens, electric heaters, and the like without specific limitations, and the solvent vapor annealing may be conducted for 1 to 24 hours.

The airtight container into which the $C_{60}$ film or conjugated molecular film is introduced may include those having an airtight function for maintaining constant vapor pressure. The size and the shape are not specifically limited, and for example, a glass bottle, a Teflon container, a PFA container, or a vial may be used.

After introducing the $C_{60}$ film or conjugated molecular film and the solvent into the airtight container, in the solvent vapor annealing, the $C_{60}$ film or conjugated molecular film and the solvent may not contact each other. That is, in order to vaporize the solvent and condense/evaporate the solvent vapor under dynamic equilibrium, the $C_{60}$ film or conjugated molecular film and the solvent may co-exist in the airtight space without contact.

After the solvent vapor annealing, the $C_{60}$ film or conjugated molecular film may be dried outside of the airtight container.

The drying is used to evaporate the condensed solvent in the $C_{60}$ film or conjugated molecular film, after solvent vapor annealing of the $C_{60}$ film or conjugated molecular film, and it may be conducted at room temperature and in the air for 1 to 24 hours.

According to the method for preparing vertically grown nanostructures of $C_{60}$ and conjugated molecules of the above-explained embodiment, vertically grown nanostructures wherein $C_{60}$ molecules and conjugated molecules are vertically crystallized may be obtained, and the shape and the structure of the nanostructures may be confirmed by SEM images, TEM images, XRD patterns, Raman spectra, SAED patterns, and the like.

Advantageous Effects

According to the present invention, a method for preparing vertically grown nanostructures by vertical crystallization of $C_{60}$ and conjugated molecules under mild conditions by a simpler process may be provided.

DETAILED DESCRIPTION OF THE EMBODIMENTS

The present invention will be explained in detail with reference to the following Examples. However, these examples are only to illustrate the invention, and the scope of the invention is not limited thereto.

Experimental Example

Structural Characterization of Nanostructures

The morphologies of the structures of $C_{60}$, conjugated molecules prepared below were examined by scanning electron microscopy (SEM, JEOL, JSM-7410F) with an ultrathin Pt coating. Structural information of the nanostructure was obtained by transmission electron microscopy (TEM, Carl Zeiss, EM 912 omega), selected area electron diffraction (SAED), and powder X-ray diffraction (XRD). A single $C_{60}$ nanostructure was prepared on a Cu grid (Ted Pella, Inc., 400 mesh) by mildly sliding a Cu grid on vertically grown structures for TEM analysis. X-ray diffraction data were obtained from the 5D beamline at the Pohang Accelerator Laboratory ($\lambda=1.2390$ Å). All obtained data were converted to CuK$\alpha$ ($\lambda=1.54057$ Å) radiation scale. To determine the solvation of vertical $C_{60}$ nanostructures, Raman spectra were acquired by using a Raman spectroscope (Alpha 300R, WITEC) equipped with a 532 nm diode laser (power=0.1 mW, grating=1800 g/mm, BLZ=500 nm).

Example 1

$C_{60}$ fullerene powder was purchased (MTR Ltd., purity>99.95%) and used without further purification, and a Si substrate was prepared by rinsing with deionized water followed by rinsing with acetone and isopropyl alcohol, then blowing with $N_2$ gas.

A $C_{60}$ film was prepared by thermally evaporating $C_{60}$ fullerene powder on a pre-cleaned Si substrate at 540° C. for 7 h (average thickness of 60 nm).

Next, the prepared $C_{60}$ film sample was put into a vial (70 mL) in which 5 mL of m-xylene (Sigma-Aldrich, 99%) was preloaded. To avoid direct contact between the $C_{60}$ film sample and solvent, a smaller vial (20 mL) pillar was placed inside the vial in which the $C_{60}$ film sample was placed. Then the vial was capped to trap solvent vapors inside the vial and placed in an oven preset to 28° C. for 12 h. Once the reaction was completed, the $C_{60}$ film sample was carefully taken out of the vial, then left in air for 6 h or more to completely dry the solvents from the sample, thus preparing vertically grown nanostructures of $C_{60}$ molecules.

Figure 2:
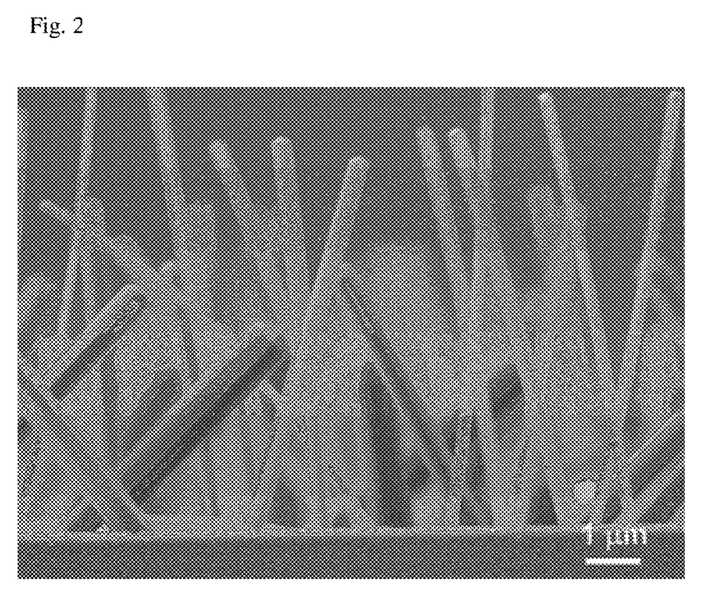
FIG. 2 shows a SEM image of a vertically grown nanostructure of $C_{60}$ molecules of Example 1.
Figure 3:
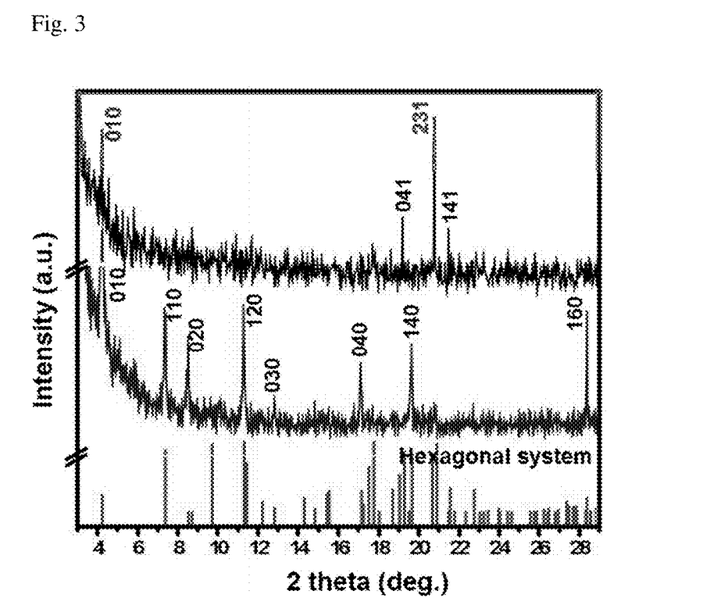
FIG. 3 shows an XRD patterns of the vertically grown nanostructure of $C_{60}$ molecules of Example 1.
Figure 4:
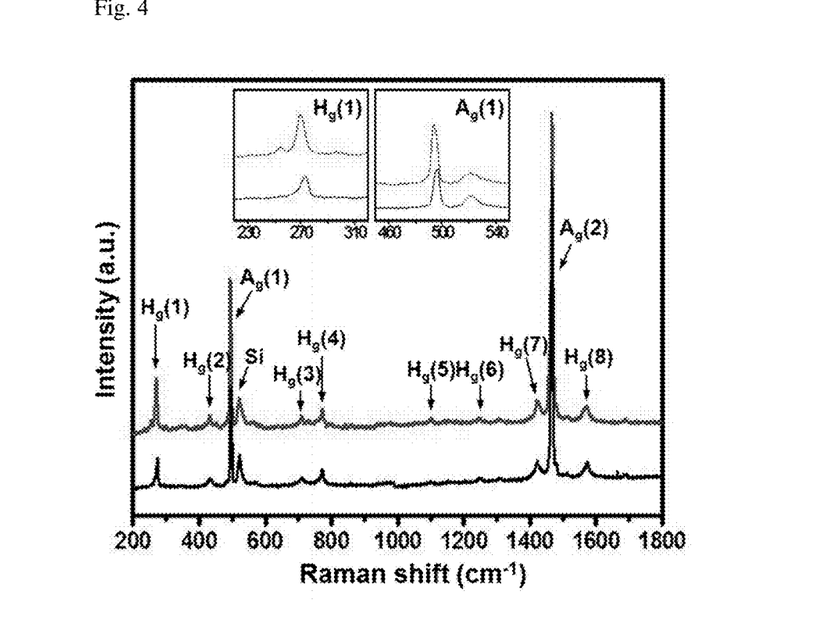
FIG. 4 shows a Raman spectra of the vertically grown nanostructure of $C_{60}$ molecules of Example 1.
Figure 5:
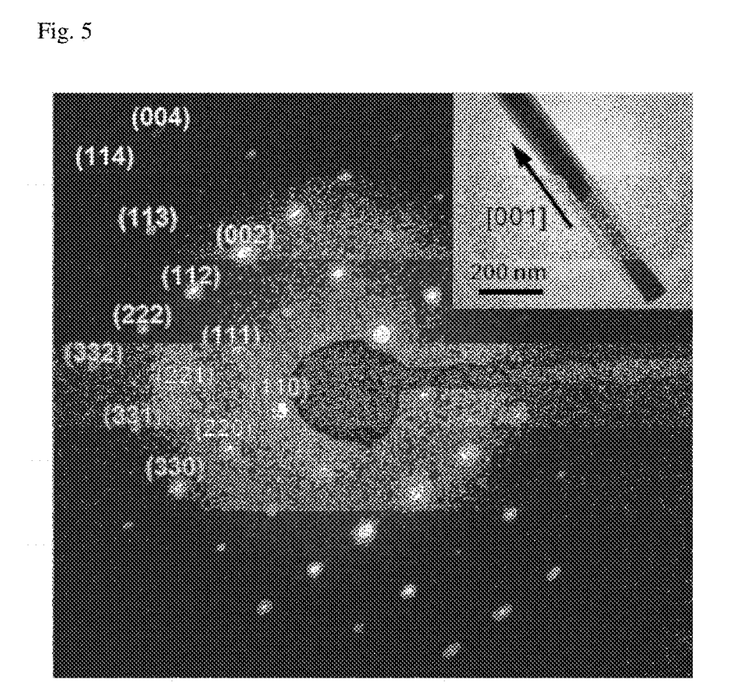
FIG. 5 shows a SAED pattern of the vertically grown nanostructure of $C_{60}$ molecules of Example 1.

The SEM image of vertically grown nanostructures of $C_{60}$ molecules of Example 1 is shown in FIG. 2, and the XRD patterns, Raman spectra, and SAED patterns are shown in FIGS. 3 to 5, respectively.

As show in the SEM image of FIG. 2, the nanostructures of Example 1 are in the form of vertically grown crystals on the substrate, and, the SAED pattern shown in FIG. 5 confirms that the $C_{60}$ nanostructure is single crystalline with a zone axis of [1-10] and crystal growth axis of [001].

Further, FIG. 3 shows the XRD patterns of the as-grown vertical nanostructures of Example 1 (black) and nanostructures laying down on a substrate by mechanically pressing down the vertical nanostructures at a slight off-angle (blue), and it confirms that the nanostructures of Example 1 have the same crystal structure as other nanostructures using the same solvent.

Next, the Raman shift of FIG. 4 confirms that the nanostructures of Example 1 are solvated with m-xylene, which is inferred from the fact that the nanostructures of Example 1 show $H_g(1)$ mode Raman peak shifts from 272 to 270 cm$^{-1}$ and Ag(1) mode shifts from 496 to 494 cm$^{-1}$.

Example 2

Vertically grown nanostructures of $C_{60}$ molecules were prepared by the same method as Example 1, except that thermal evaporation was conducted at 450° C. for 3 hours and 30 minutes, the $C_{60}$ film was prepared to a thickness of 10 nm, and $CCl_4$ (Sigma-Aldrich, 99.9%) was used as a solvent instead of m-xylene.

Figure 6:
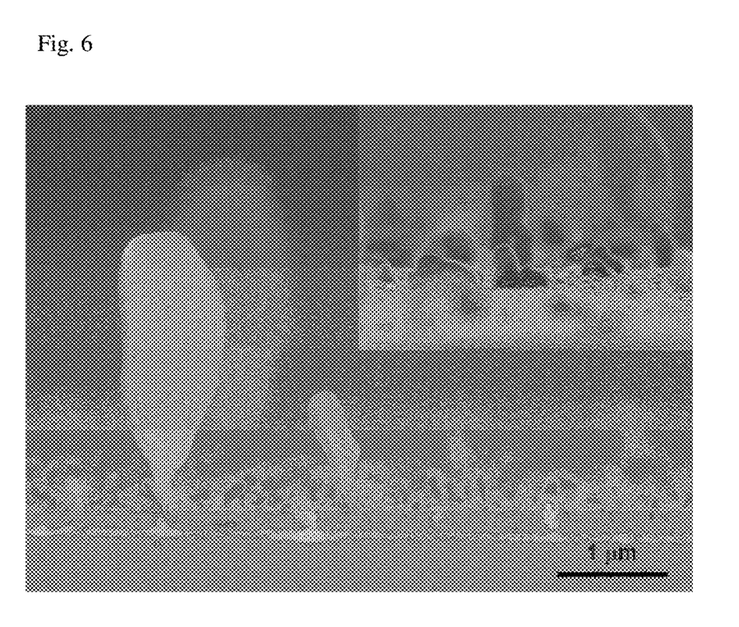
FIG. 6 shows a SEM image of the vertically grown nanostructure of $C_{60}$ molecules of Example 2.
Figure 7:
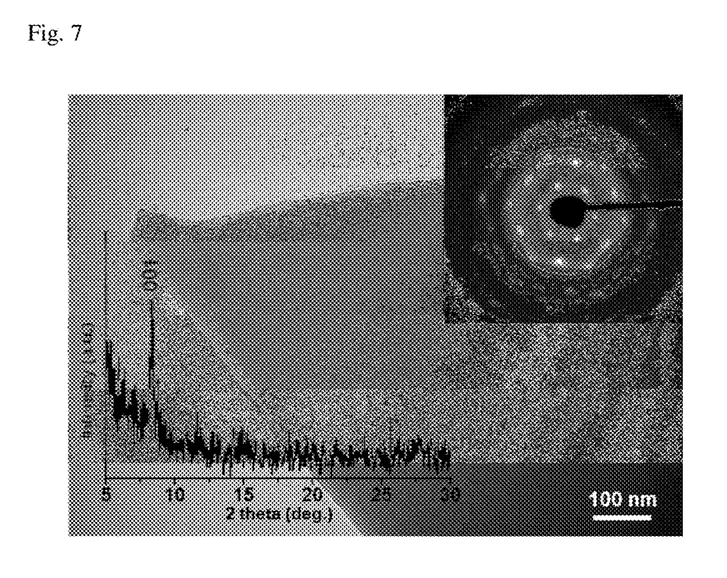
FIG. 7 shows XRD and SAED patterns of the vertically grown nanostructure of $C_{60}$ molecules of Example 2.

The SEM image and the XRD SAED patterns of the $C_{60}$ nanostructures of Example 2 are shown in FIG. 6 and FIG. 7.

The SEM image of FIG. 6 confirms that the nanostructures of Example 2 are in the form of vertically grown crystals on the substrate, and the XRD and SAED patterns of FIG. 7 confirm that the crystals have a hexagonal system.

Example 3

Vertically grown nanostructures of $C_{60}$ molecules were prepared by the same method as Example 1, except that thermal evaporation was conducted at 450° C. for 3 hours and 30 minutes, the $C_{60}$ film was prepared to a thickness of 10 nm, and mesitylene (Sigma-Aldrich, 98%) was used as a solvent instead of m-xylene.

Figure 8:
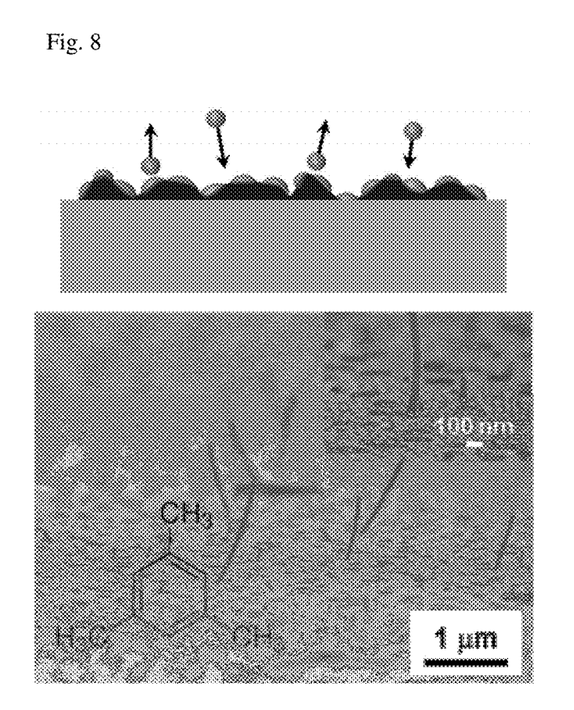
FIG. 8 shows a SEM image of the $C_{60}$ nanostructure of Example 3.

The SEM image of the $C_{60}$ nanostructures of Example 3 is shown in FIG. 8.

The SEM image of FIG. 8 confirms that the nanostructures of Example 3 are in the form of vertically grown crystals of about 1 μm length on the substrate.

Example 4

Vertically grown nanostructures of conjugated molecules were prepared by the same method as Example 1, except that 5,7,12,14-pentacenetetrone was used instead of $C_{60}$ fullerene powder, thermal evaporation was conducted under $3\times10^{-6}$ Torr, at 300° C., and for 3 hours 30 minutes, the film was prepared to a thickness of 60 nm, and toluene was used as solvent.

Figure 9:
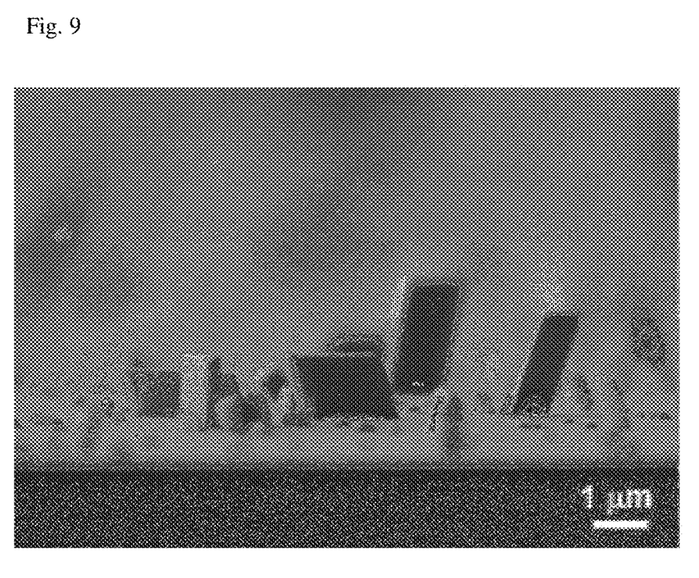
FIG. 9 shows a SEM image of the nanostructure of conjugated molecules of Example 4.

The SEM image of the nanostructures of conjugated molecules of Example 4 is shown in FIG. 9.

The SEM image of FIG. 9 confirms that the nanostructures of Example 4 are in the form of vertically grown crystals on the substrate.

Example 5

Vertically grown nanostructures of conjugated molecules were prepared by the same method as Example 5, except that $CH_2Cl_2$ was used instead of the toluene solvent.

Figure 10:
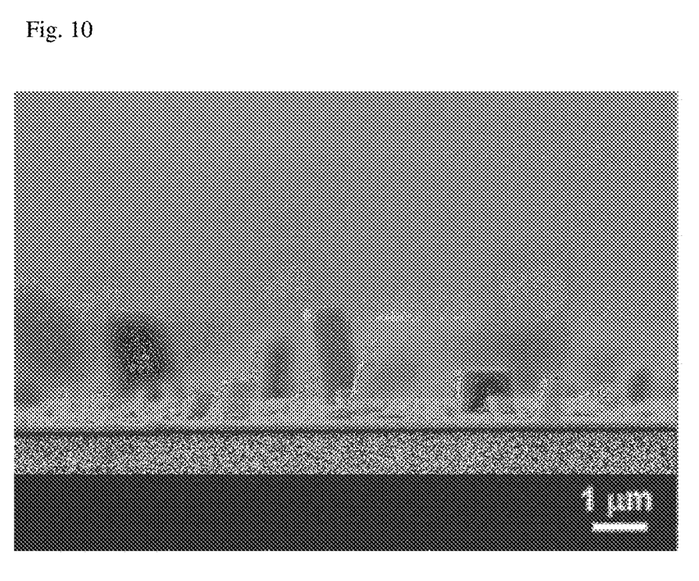
FIG. 10 shows a SEM image of the nanostructure of the conjugated molecules of Example 5.

The SEM image of the nanostructures of conjugated molecules of Example 5 is shown in FIG. 10.

The SEM image of FIG. 10 confirms that the nanostructures of Example 5 are in the form of vertically grown crystals on the substrate.

Comparative Example 1

A saturated pentacenetetrone solution was prepared by adding an excess amount of pentacenetetrone in toluene (Fisher Scientific, HPLC grade) followed by ultrasonication for 3 hours or more and filtrating (Whatman International Ltd., pore size<20 nm) the precipitates. An aliquot (about 5 uL) of the saturated pentacenetetrone solution was dripped on a Si substrate, and then the solvent was naturally dried to prepare nanostructures of conjugated molecules.

Figure 11:
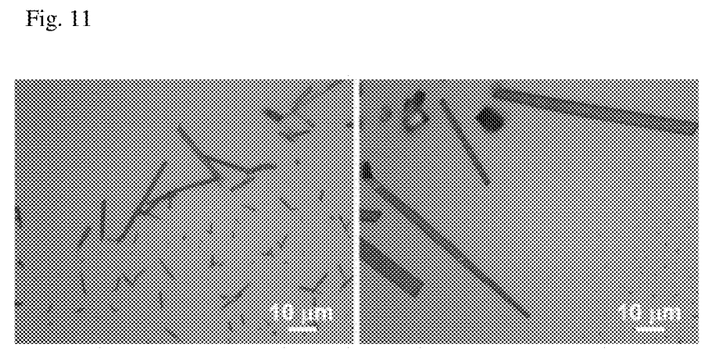
FIG. 11 shows an optical microscope image of the nanostructure of conjugated molecules of Comparative Example 1.

The optical microscope image of the nanostructures of conjugated molecules of Comparative Example 1 is shown in FIG. 11.

FIG. 11 confirms that the nanostructures of Comparative Example 1 have a pentacenetetrone anisotropic structure laying down on a substrate.

Comparative Example 2

Nanostructures of conjugated molecules were prepared by the same method as Comparative Example 1, except that $CH_2Cl_2$ (Fisher Scientific, HPLC grade) was used as a solvent instead of toluene.

Figure 12:
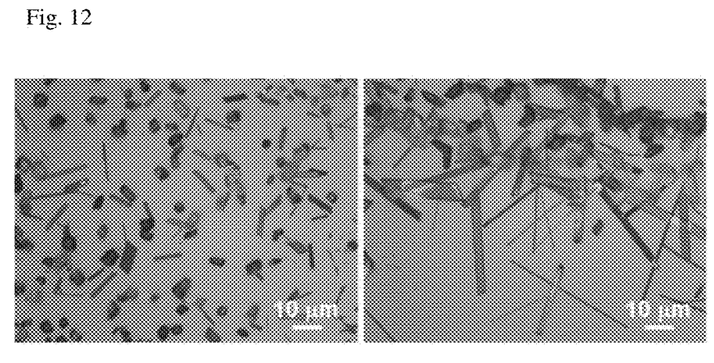
FIG. 12 shows an optical microscope image of the nanostructures of conjugated molecules of Comparative Example 2.

The optical microscope image of the nanostructures of conjugated molecules of Comparative Example 2 is shown in FIG. 12.

FIG. 12 confirms that the nanostructures of Comparative Example 2 have a pentacenetetrone anisotropic structure laying down on a substrate.

Comparative Example 3

Nanostructures of conjugated molecules were prepared by the same method as Comparative Example 1, except that $C_{60}$ fullerene powder was used instead of pentacenetetrone, and m-xylene was used as a solvent instead of toluene.

Figure 13:
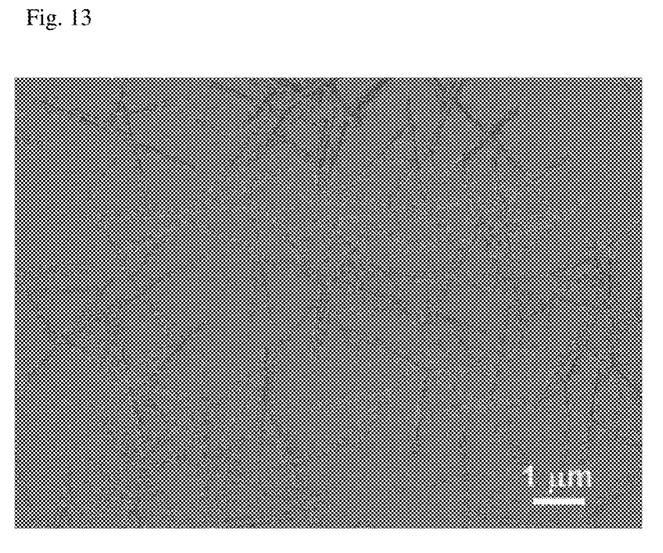
FIG. 13 shows a SEM image of the nanostructure of $C_{60}$ molecules of Comparative Example 3.

The optical microscope image of the nanostructures of conjugated molecules of Comparative Example 3 is shown in FIG. 13.

FIG. 13 confirms that the nanostructures of Comparative Example 3 have a pentacenetetrone anisotropic structure laying down on a substrate.

Comparative Example 4

A saturated $C_{60}$ fullerene solution was prepared by adding an excess amount of $C_{60}$ fullerene powder in toluene (Fisher Scientific, HPLC grade) followed by ultrasonication for 3 hours or more and filtrating (Whatman International Ltd., pore size<20 nm) the precipitates. An aliquot (about 5 uL) of the saturated pentacenetetrone solution was dripped on a Si substrate, to prepare a $C_{60}$ fullerene solution substrate.

Next, the prepared $C_{60}$ fullerene solution substrate were put into a vial (70 mL) in which 5 mL of m-xylene (Sigma-Aldrich, 99%) was preloaded. To avoid direct contact between the substrate on which $C_{60}$ fullerene solution exists and the m-xylene solvent, a smaller vial (20 mL) pillar was placed inside the vial on which the $C_{60}$ fullerene solution substrate was placed. Then the vial was capped to trap solvent vapors inside the vial and placed in an oven preset to 28° C. for 12 h. Once the reaction was completed, the $C_{60}$ fullerene solution substrate was carefully taken out of the vial, then left in air for 6 h or more to completely dry the solvents from the substrate, thus preparing nanostructures of $C_{60}$ molecules.

Figure 14:
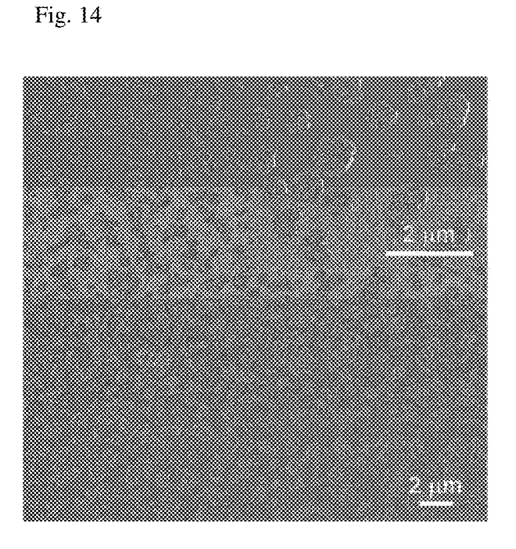
FIG. 14 shows a SEM image of the C60 fullerene solution substrate of Comparative Example 4.
Figure 15:
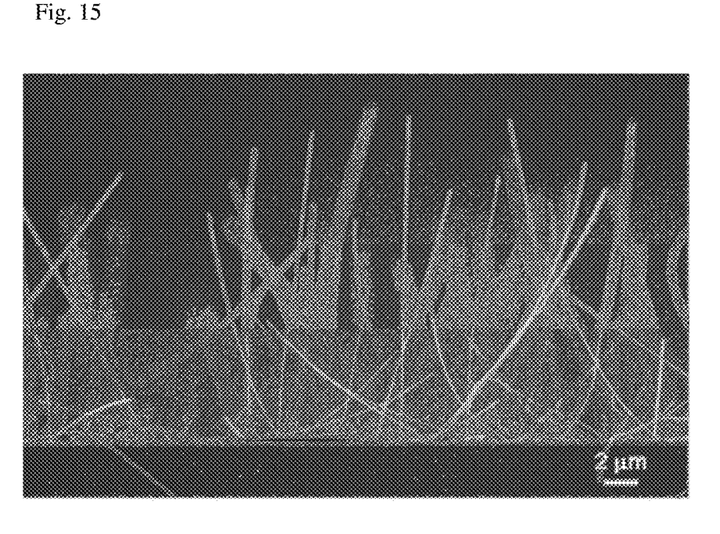
FIG. 15 shows a SEM image of the nanostructure of $C_{60}$ molecules of Comparative Example 4.

The SEM image of the $C_{60}$ fullerene solution substrate is shown in FIG. 14, and the SEM image of the nanostructures of $C_{60}$ molecules prepared in Comparative Example 4 is shown in FIG. 15.

FIG. 15 confirms that the nanostructures of the comparative examples have comparatively thin and long shapes.

The invention claimed is:

1. A method for preparing vertically grown nanostructures of $C_{60}$ or conjugated molecules comprising:
   forming a $C_{60}$ film or a conjugated organic molecular film; and
   introducing the $C_{60}$ film or conjugated organic molecule film and a solvent into an airtight container, and
   conducting solvent vapor annealing while controlling a direction of the solvent movement to form the vertically grown nanostructures,
   wherein the direction of the solvent movement is controlled by maximizing a vertical drying force of the solvent while minimizing a lateral force of the solvent,
   wherein the conjugated organic molecule is 5,7,12,14-pentacenetetrone, and the solvent includes at least one selected from the group consisting of m-xylene, $CCl_4$, mesitylene, toluene, and $CH_2Cl_2$.

2. The method according to claim 1, wherein the forming a $C_{60}$ film or a conjugated organic molecular film comprises thermally evaporating $C_{60}$ molecules or conjugated organic molecules on a substrate.

3. The method according to claim 2, wherein the substrate is made of quartz, a silicon oxide, or silicon.

4. The method according to claim 2, wherein the thermal evaporation of $C_{60}$ molecules or conjugated organic molecules on a substrate is conducted at a temperature of greater than or equal to 200° C.

5. The method according to claim 1, wherein the thickness of the $C_{60}$ film or conjugated organic molecular film is 10 to 100 nm.

6. The method according to claim 1, wherein the solvent vapor annealing is conducted at 20 to 50° C.

7. The method according to claim 1, wherein the solvent vapor annealing is conducted for 1 to 24 hours.

8. The method according to claim 1, wherein the airtight container is a glass bottle, a Teflon container, a PFA container, or a vial.

9. The method according to claim 1, further comprising drying the $C_{60}$ film or conjugated organic molecular film outside of the airtight container, after conducting solvent vapor annealing.

10. The method according to claim 9, wherein the drying is conducted for 1 to 24 hours.

* * * * *